US012032876B2

(12) United States Patent
Ermler et al.

(10) Patent No.: US 12,032,876 B2
(45) Date of Patent: Jul. 9, 2024

(54) DEVICE AND METHOD FOR SIMULATING A CONTROLLED MACHINE OR INSTALLATION

(71) Applicant: Siemens Aktiengesellschaft, Munich (DE)

(72) Inventors: Rene Ermler, Erlangen (DE); Cornelia Krebs, Rückersdorf (DE); Jörg Neidig, Nuremberg (DE); Gustavo Arturo Quiros Araya, Princeton, NJ (US)

(73) Assignee: Siemens Aktiengesellschaft, Munich (DE)

( * ) Notice: Subject to any disclaimer, the term of this patent is extended or adjusted under 35 U.S.C. 154(b) by 615 days.

(21) Appl. No.: 16/264,254

(22) Filed: Jan. 31, 2019

(65) Prior Publication Data

US 2019/0236224 A1    Aug. 1, 2019

(30) Foreign Application Priority Data

Feb. 1, 2018    (EP) ..................................... 18154633

(51) Int. Cl.
*G06F 30/20* (2020.01)
*G05B 17/02* (2006.01)
(Continued)

(52) U.S. Cl.
CPC ............. *G06F 30/20* (2020.01); *G05B 17/02* (2013.01); *G05B 19/41885* (2013.01);
(Continued)

(58) Field of Classification Search
CPC .......... G05B 2219/13186; G05B 2219/23456; G05B 13/047; G05B 2219/23445;
(Continued)

(56) References Cited

U.S. PATENT DOCUMENTS 10,012,979 B2 * 7/2018 Grgic ............... G05B 19/41835
10,901,794 B2 * 1/2021 Ermler .................... G06F 9/455
(Continued)

FOREIGN PATENT DOCUMENTS

CN 101620548 A 1/2010
CN 102662428 A 9/2012
(Continued)

*Primary Examiner* — Akash Saxena
(74) *Attorney, Agent, or Firm* — Henry M. Feiereisen LLC

(57) ABSTRACT

A device for simulating a controlled machine or installation includes a process simulation apparatus designed to perform simulation steps that simulate a physical process of the machine or installation, and a controller simulation apparatus designed to perform simulation steps that simulate a controller of the machine or installation. The process simulation apparatus and the controller simulation apparatus exchange particular output values so as to simulate the controlled machine or installation in the respective simulation steps. The controller simulation apparatus transmits an item of information to the process simulation apparatus, which item of information describes a result time for an end of a simulation step performed by the controller simulation apparatus, while the process simulation apparatus is designed to adjust a duration of at least one of the simulation steps depending on the result time.

11 Claims, 4 Drawing Sheets

(51) Int. Cl.
*G05B 19/418* (2006.01)
*G06F 11/26* (2006.01)
(52) U.S. Cl.
CPC .............. *G05B 2219/13185* (2013.01); *G05B 2219/13186* (2013.01); *G05B 2219/23445* (2013.01); *G05B 2219/23456* (2013.01); *G06F 11/261* (2013.01)
(58) Field of Classification Search
CPC ........... G05B 2219/13185; G05B 2219/25049; G05B 2219/32416; G05B 2219/36381; G05B 2219/1211; G05B 2219/13063; G06F 2207/3864
See application file for complete search history.

(56) References Cited

U.S. PATENT DOCUMENTS

| | | | | |
|---|---|---|---|---|
| 10,949,592 B1* | 3/2021 | Homma | ............... | G06F 30/3312 |
| 2007/0233286 A1* | 10/2007 | Ishikawa | ................ | G05B 17/02 |
| | | | | 700/29 |
| 2008/0168092 A1* | 7/2008 | Boggs | ..................... | G06F 30/33 |
| | | | | 703/22 |
| 2010/0057428 A1 | 3/2010 | Jeschin | | |
| 2013/0151220 A1* | 6/2013 | Matsumura | ........... | G06F 11/261 |
| | | | | 703/7 |
| 2014/0025365 A1* | 1/2014 | Kajitani | .................. | G06F 30/20 |
| | | | | 703/24 |
| 2015/0019191 A1* | 1/2015 | Maturana | ........... | G05B 19/0423 |
| | | | | 703/13 |
| 2015/0058828 A1* | 2/2015 | Narutani | ................ | G05B 17/02 |
| | | | | 717/135 |
| 2015/0134313 A1* | 5/2015 | Maturana | ................ | G06F 9/541 |
| | | | | 703/6 |
| 2016/0246278 A1* | 8/2016 | Tanide | ................ | G05B 19/056 |
| 2016/0274553 A1* | 9/2016 | Strohmenger | .......... | G05B 17/02 |
| 2018/0203973 A1* | 7/2018 | Ermler | .................. | G05B 19/05 |
| 2019/0047146 A1* | 2/2019 | Oya | ................ | G05B 19/056 |
| 2019/0227534 A1* | 7/2019 | Shimakawa | ...... | G05B 19/41885 |
| 2019/0236224 A1* | 8/2019 | Ermler | .................... | G06F 30/20 |
| 2019/0265668 A1* | 8/2019 | Kuya | ..................... | G05B 19/05 |
| 2020/0409346 A1* | 12/2020 | Schlereth | .......... | G05B 19/41885 |
| 2021/0232106 A1* | 7/2021 | Wen | ........................ | G05B 17/02 |

FOREIGN PATENT DOCUMENTS

| | | |
|---|---|---|
| DE | 102007026502 | 12/2008 |
| EP | 2980661 A1 | 2/2016 |
| WO | WO2015/124170 | 8/2015 |
| WO | WO 2015124170 A1 | 8/2015 |

* cited by examiner

DEVICE AND METHOD FOR SIMULATING A CONTROLLED MACHINE OR INSTALLATION

CROSS-REFERENCES TO RELATED APPLICATIONS

This application claims the priority of European Patent Application, Serial No. EP18154633.4, filed Feb. 1, 2018, pursuant to 35 U.S.C. 119(a)-(d), the disclosure(s) of which is/are incorporated herein by reference in its entirety as if fully set forth herein.

BACKGROUND OF THE INVENTION

The present invention relates to a device for simulating a controlled machine or installation, and to a method for simulating a controlled machine or installation.

The following discussion of related art is provided to assist the reader in understanding the advantages of the invention, and is not to be construed as an admission that this related art is prior art to this invention.

To simulate an automated system, such as a controlled machine, a controlled installation, a robot cell or a production process, it is necessary for the physical process to be simulated in combination with a simulation of the controller, for example of the controller program for the automation. The physical process is generally modeled mathematically and simulated using corresponding simulation tools. If the inspection requires precise analysis of the control system, however, it is expedient for the original controller program to be executed in a software-emulated controller.

In this case, the problem is that a physical process constantly changes and also interacts with the environment. By contrast, a controller interacts only at particular times that are not generally known in advance. Simulation tools have a dedicated internal increment controller for the simulation steps that determines the times at which the results should be calculated. These simulation steps are not synchronized with the interaction points of the controller. Therefore, overall, the simulation will always exhibit a systematic simulation error because the simulation of the physical process performs its calculation using outdated input values of the simulation of the controller.

This problem has to date not yet been solved. The behaviour of the emulated controller is an exact replica of the behaviour of a real controller, for example of a programmable logic controller. In this case, there are individual times at which interaction with the environment is possible, these times generally being unknown. The behaviour of the emulation is not able to be changed without the validity of the simulation result being lost. If possible, the simulation of the physical process is typically set at a fixed increment so as to obtain a more predictable timing behaviour. This is however at the expense of performance and/or accuracy. The resulting simulation error is sometimes acceptable; in other words the simulation may be "good enough". However, above all in the simulation of systems in which timing is critical, the available set-ups are not able to be used. The systematic simulation error is able to be reduced through a considerable reduction of the simulation increment. However, this leads to a higher computational burden and to a worse performance.

It would therefore be desirable and advantageous to provide an improved device and method to obviate prior art shortcomings and to simulate a controlled machine or installation more reliably with lower computational burden.

SUMMARY OF THE INVENTION

According to one aspect of the present invention, a device for simulating a controlled machine or installation includes a process simulation apparatus that is designed to perform simulation steps so as to simulate a physical process of the machine or installation. The device additionally comprises a controller simulation apparatus that is designed to perform simulation steps so as to simulate a controller of the machine or installation. The process simulation apparatus and the controller simulation apparatus are designed to exchange particular output values so as to simulate the controlled machine or installation in the respective simulation steps. It is furthermore provided that the controller simulation apparatus is designed to transmit an item of information to the process simulation apparatus, which item of information describes a result time for an end of a simulation step performed using the controller simulation apparatus. The process simulation apparatus is furthermore designed to adjust a duration of at least one of the simulation steps depending on the result time.

By way of the process simulation apparatus, the behaviour of the machine or installation during operation is able to be simulated. Using the device, an automated system is thus intended to be simulated that comprises a controller and the machine or installation, operation of the machine or installation being controlled and/or regulated by way of the controller. By way of the controller simulation apparatus, the behaviour of the controller when the machine or installation is controlled or regulated is able to be simulated. In particular, by way of the controller simulation apparatus, it is possible to simulate a controller that is configured as a programmable logic controller (PLC). Using the controller simulation apparatus, the temporally consecutive simulation steps are able to be performed so as to replicate the behaviour of the programmable logic controller. By way of example, a control system for regulating the machines or installations is able to be simulated by way of the controller simulation apparatus. The controller simulation apparatus in particular comprises an emulator on which the real control program of the controller is executed. This affords the advantage that the behaviour of the real control program is able to be inspected. It is therefore not necessary, for example, for the behaviour of the controller to be described mathematically, for example, and to be replicated using a corresponding simulation tool. The temporally consecutive simulation steps are likewise able to be performed using the process simulation apparatus. In the respective simulation steps, output values are determined that describe the physical behaviour of the machine or installation. By way of example, the output values may describe a position, a speed, an acceleration or the like.

The respective simulation steps that are performed using the controller simulation apparatus and the process simulation apparatus are determined depending on a virtual time. The controller simulation apparatus and the process simulation apparatus may for example be operated sequentially. By way of the controller simulation apparatus, output values are able to be determined in the respective simulation steps and transmitted to the process simulation apparatus. These output values may be used by the process simulation apparatus as input values for the subsequent simulation steps. In the same way, the output values that are determined by way of the process simulation apparatus may be used as input values for the subsequent simulation steps of the controller simulation apparatus. Co-simulation may thus be made possible.

According to the present invention, it is provided that the controller simulation apparatus determines a result time that describes a time or a virtual time at which one of the simulation steps ended. The controller simulation apparatus may for example determine a result time for each simulation step that is performed. This result time is then transmitted to the process simulation apparatus by the controller simulation apparatus. After reception, the process simulation apparatus may adjust the at least one simulation step that is subsequently performed thereby to this result time. In particular, an increment or a duration of the at least one simulation step is able to be adjusted using the process simulation apparatus. It is thereby made possible for the increments of the process simulation to be adjusted dynamically to the increments of the simulation of the controller. A situation whereby outdated input values are used in the co-simulation and a simulation error thus occurs is thus able to be prevented. The simulation of the controlled machine or installation is thus able to be performed in a more reliable manner overall.

The process simulation apparatus is preferably designed to adjust the duration of the at least one simulation step that is performed thereby such that the at least one simulation step ends at the result time. A main cycle of the controller is able to be simulated using the controller simulation apparatus, for example. The result time describes the virtual time up to which this main cycle was simulated. One or more simulation steps are then able to be performed during a simulation cycle using the process simulation apparatus. The respective duration of the simulation steps may be determined such that the simulation cycle ends at the result time. The simulation of the physical process and the simulation of the controller may thus each be performed until the result time. For subsequent simulation cycles, the respectively determined output values may be exchanged between the process simulation apparatus and the controller simulation apparatus. A situation whereby outdated output values are used in the simulation is thus able to be prevented.

The process simulation apparatus preferably has an apparatus that is designed to adjust the duration of the at least one simulation step depending on the result time. Both the process simulation apparatus and the controller simulation apparatus may comprise a respective virtual clock. The controller simulation apparatus is able to determine the result time on the basis of the virtual clock. After reception of the result time, the process simulation apparatus may then use its virtual clock to determine how the increments of the simulation steps should be adjusted.

In a further refinement, the controller simulation apparatus has an event generator that is designed to generate an event signal, wherein the event signal describes the result time. In addition, the process simulation apparatus may have an event receiver for receiving the event signal. By way of the controller simulation apparatus, a result is thus able to be generated if a simulation step has ended. In addition to the event signal, the controller simulation apparatus may also transmit the output values, determined in the simulation step, to the process simulation apparatus. The co-simulation is thus able to be performed precisely.

Furthermore, it is advantageous if the controller simulation apparatus is designed to transmit the output values, determined in a simulation step, to the process simulation apparatus, and the process simulation apparatus is designed to use these output values as input values for the at least one simulation step that is performed. It may also be provided that the process simulation apparatus is designed to transmit the output values, determined in a simulation step, to the controller simulation apparatus, and the controller simulation apparatus is designed to use these output values as input values for a simulation step that is performed subsequently. In this way, co-simulation is made possible so as to predict the behaviour of the controlled machine or installation.

In a further embodiment, the process simulation apparatus has a buffer for storing the input values. It is provided in this case in particular that the process simulation apparatus is designed to select at least one of the stored input values depending on a time at which said input value was determined. By way of the device, parallel execution of the simulation of the physical process and of the simulation of the controller may advantageously also be made possible. The process simulation apparatus contains the buffer in which a sequence of input values is able to be stored. If a new simulation is started or a new simulation cycle is begun by way of the process simulation apparatus, those input values that were determined at a latest possible time or that have the highest timestamp may be selected from the buffer. When selecting the input values, it should additionally be taken into consideration that these were determined at a time before the result time. The duration of the at least one simulation step may then be adjusted to the result time for this simulation.

It is furthermore advantageous if the process simulation apparatus has a buffer for storing the output values, wherein the process simulation apparatus is designed to delete output values that were determined after the result time. For a subsequent simulation or a subsequent simulation cycle, the process simulation apparatus may empty the buffer and use only those input values that it obtained together with the result time. The process simulation apparatus and the controller simulation apparatus thus always operate using up-to-date input values.

As already explained, the controller simulation apparatus preferably has an emulator for performing a control program of the controller. The real control program or the real controller software of the programmable logic controller may be replicated on this emulator. The control and/or regulation of the machine or installation is thus able to be simulated in a manner close to reality.

In a further embodiment, it is provided that the device comprises a multiplicity of process simulation apparatuses and/or a multiplicity of controller simulation apparatuses. In other words, the method may be expanded to a plurality of process simulation apparatuses and/or a plurality of controller simulation apparatuses. In this case too, it is provided in particular that a result time is determined using each of the controller simulation apparatuses and is transmitted to the controller simulation apparatuses. The controller simulation apparatuses are able to adjust the respective duration of the simulation steps to the result time.

According to one aspect of the present invention, a method is used to simulate a controlled machine or installation. The method comprises simulating a physical process of the machine or installation by performing simulation steps by way of a process simulation apparatus. The method additionally includes simulating a controller of the machine or installation by performing simulation steps by way of a controller simulation apparatus. The method furthermore comprises exchanging output values, determined in the respective simulation steps, between the process simulation apparatus and the controller simulation apparatus so as to simulate the controlled machine or installation. In this case, it is provided that an item of information is transmitted to the process simulation apparatus by way of the controller simulation apparatus, which item of information describes a result time for an end of a simulation step performed using the controller simulation apparatus, and that a duration of at least one of the simulation steps is adjusted depending on the result time by way of the process simulation apparatus.

The preferred embodiments proposed with respect to the device according to the invention and the advantages thereof apply accordingly to the method according to the invention.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
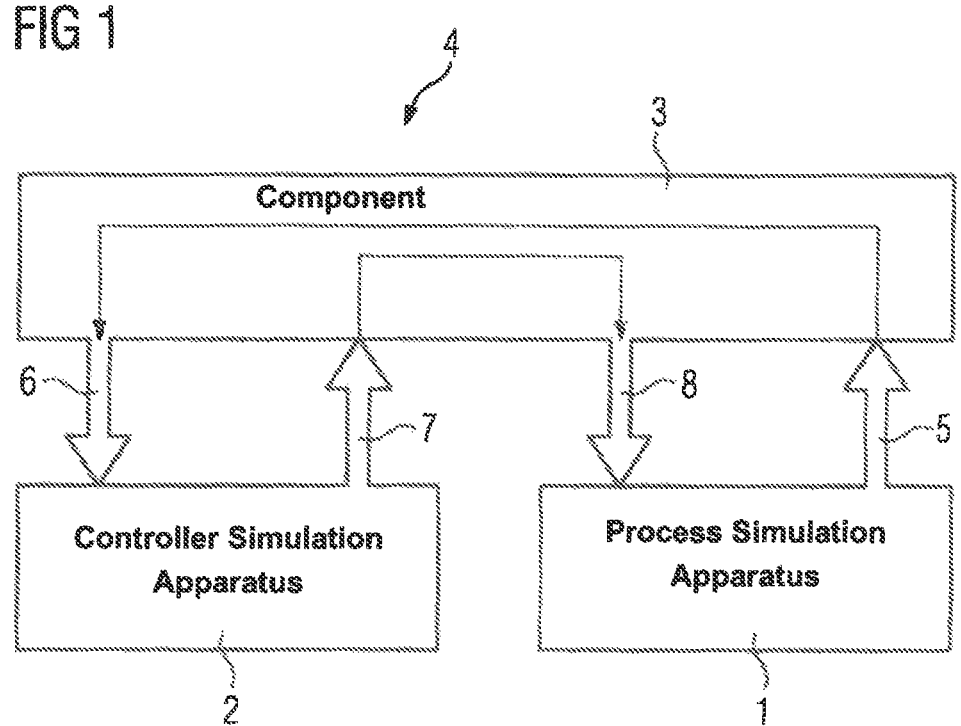
FIG. 1 shows a device for simulating a controlled machine or installation according to the prior art.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a device 4 for simulating a controlled machine or installation according to the prior art. The device 4 comprises a process simulation apparatus 1, which is used to simulate a physical process of the machine or installation. The device 4 furthermore comprises a controller simulation apparatus 2, which is used to simulate a controller by way of which the machine or installation is controlled. The controller that is simulated by way of the controller simulation apparatus 2 may be a programmable logic controller, for example. The controller simulation apparatus 2 may be provided through software emulation or an emulator. In the present case, co-simulation is performed by way of the process simulation apparatus 1 and the controller simulation apparatus 2 so as to replicate the operation of the controlled machine or installation.

The process simulation apparatus 1 and the controller simulation apparatus 2 are connected to one another for data transmission purposes. Simulation steps $S_1$ are able to be performed by way of the process simulation apparatus 1, and output values are able to be determined in the process. This is indicated in the present case by the arrow 5. These output values describe physical variables of the machine or installation. The output values or the physical variables may describe for example a position, a speed and/or an acceleration. The output values provided by the process simulation apparatus 1 may be received by the controller simulation apparatus 2 as input values (arrow 6). Output values may likewise be provided by way of the controller simulation apparatus 2. This is shown in the present case by the arrow 7. These output values may describe for example an electric current, an electric voltage and/or a frequency. The output values provided by the controller simulation apparatus 2 may in turn be received by the process simulation apparatus 1 as input values (arrow 8). In the present example, the process simulation apparatus 1 and the controller simulation apparatus 2 are connected to one another by way of a component 3. The data exchange between the process simulation apparatus 1 the controller simulation apparatus 2 is able to be controlled by way of the component 3. In this way, an indirect data connection is produced between the process simulation apparatus 1 and the controller simulation apparatus 2.

Figure 2:
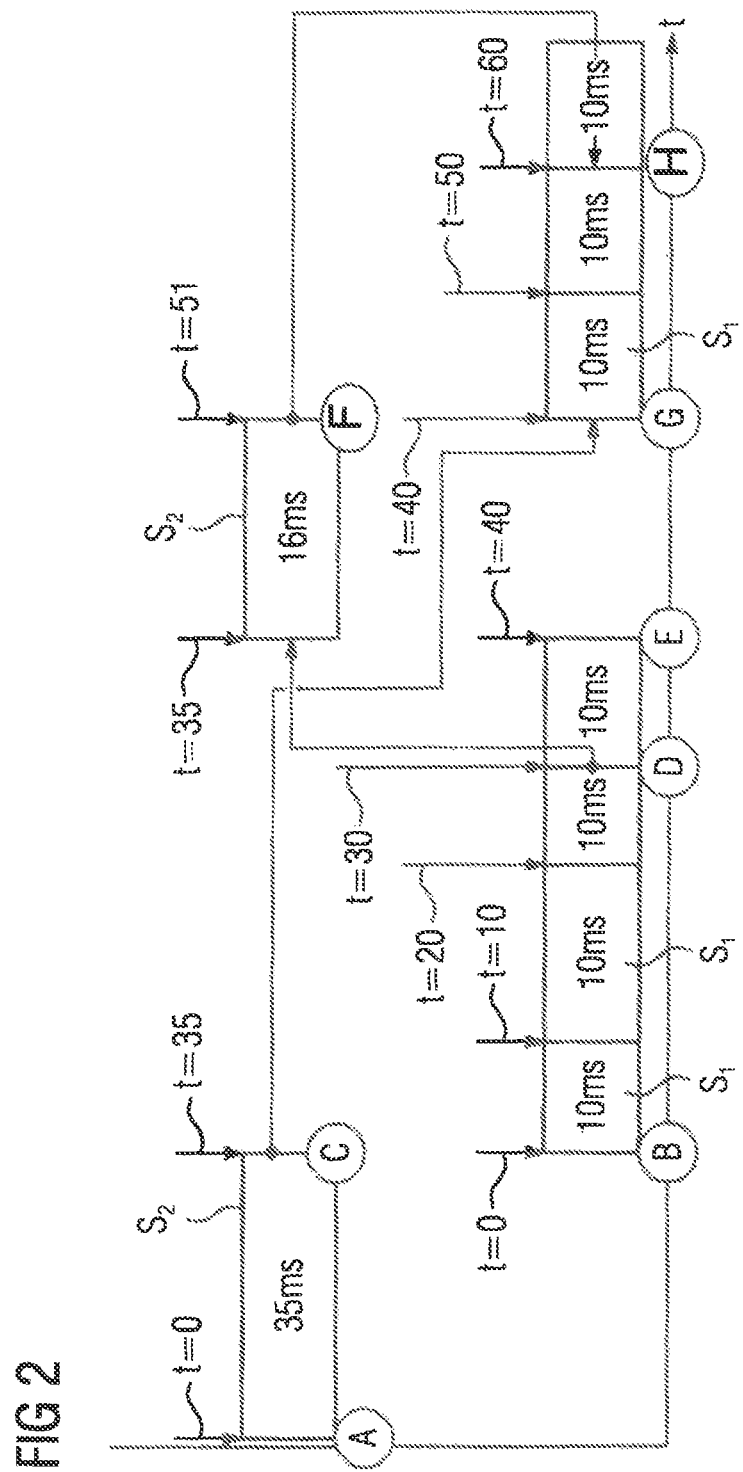
FIG. 2 shows a chronology of simulation steps that are performed using the device according to FIG. 1.

FIG. 2 shows a chronology of the simulation steps $S_1$ that are performed using the process simulation apparatus 1 and the controller simulation apparatus 2. In this case, the respective simulation steps $S_1$ are shown with respect to a virtual time t. The respectively described durations and times are given in ma (milliseconds) in this case. Since the process simulation apparatus 1 and the controller simulation apparatus 2 have to exchange the input values and/or output values in the co-simulation, they are not able to be operated in parallel, but rather the respective simulation steps S are performed sequentially. At a time t=0, the controller simulation apparatus 2 is started using initial input values (event A). In this case, a simulation step $S_2$ is performed and the output values are calculated in the process. This simulation step $S_2$ ends at a time t=35 (event C). The virtual time t for the controller simulation apparatus 2 is then stopped or frozen.

Following this, the process simulation apparatus 1 is started (event B). In this case, simulation steps $S_1$ are performed in a temporally consecutive manner using the process simulation apparatus 1, four simulation steps $S_1$ whose respective duration is 10 ms being performed in the present case. In this case, the simulation steps $S_1$ are performed until a time is reached that lies after the time t=35, namely the time t=40 (event E). In this case, the results determined in the last performed simulation step $S_1$ are not able to be used as input values for the controller simulation apparatus 2 as this would violate the correct order of the events. Therefore, the result that was determined at the time t=30 is used as input value for the controller simulation apparatus 2 (event D). For the same reason, the result of the controller simulation apparatus 2 that was determined at the time t=35 is used as input value for the process simulation apparatus 1 at the time t=40 (event G).

A further simulation step $S_2$, which ends at the time t=51 (event F), is subsequently performed by way of the controller simulation apparatus 2. Three consecutive simulation steps $S_1$ having a respective duration of 10 ms are then performed by way of the process simulation apparatus 1. In this case, the results that the controller simulation apparatus 2 determined for the time t=51 are used as input values for the time t=60 (event H). Overall, this leads to a situation whereby both simulations that are performed operate using input values that are not synchronized in terms of time. A simulation error in the entire co-simulation would therefore become unnecessarily large.

Figure 3:
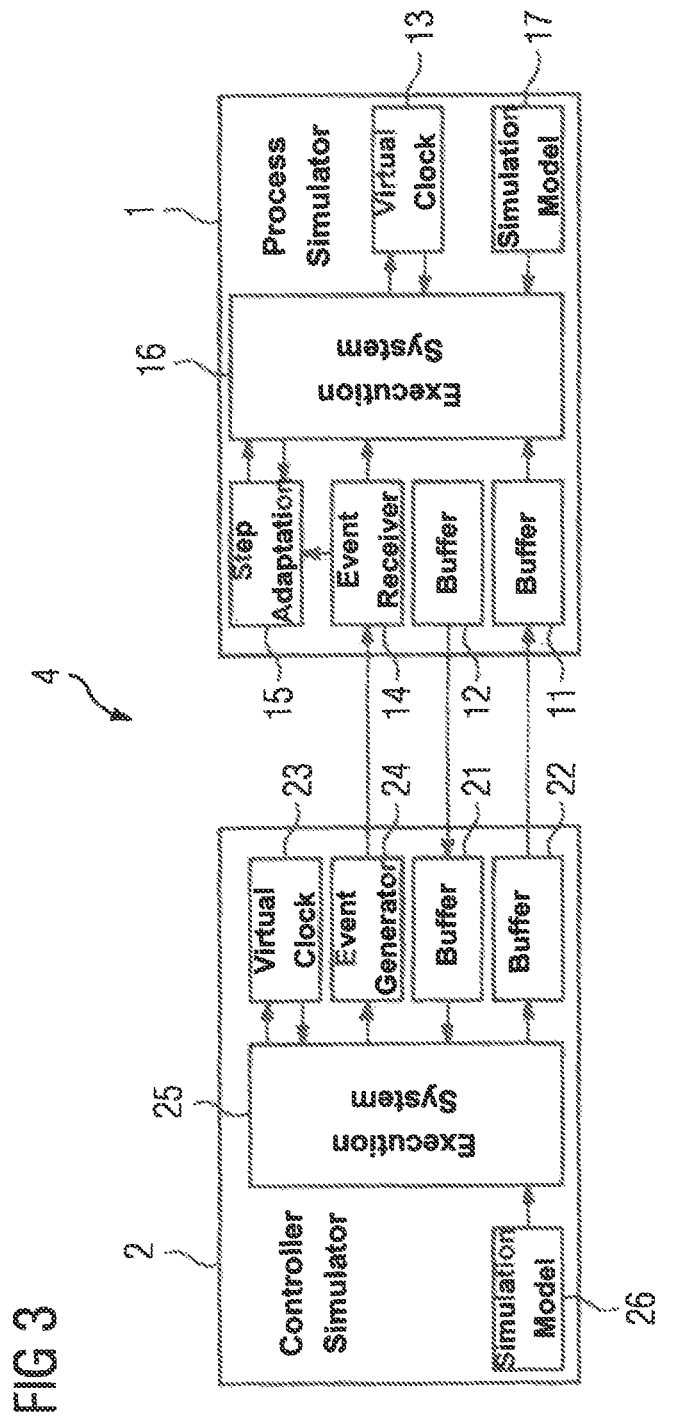
FIG. 3 shows a device for simulating a controlled machine or installation according to one embodiment of the invention.

FIG. 3 shows a device 4 according to one embodiment of the invention. This device 4 also comprises a process simulation apparatus 1 and a controller simulation apparatus 2 that are connected to one another for data transmission purposes. The process simulation apparatus 1 comprises an execution system 16 by way of which the simulation of the physical process of the machine or installation is able to be performed. A simulation model 17 or a logic model is supplied to this execution system 16. The process simulation apparatus 1 furthermore comprises a buffer 11 for the input values and a buffer 12 for the output values. The process simulation apparatus 1 furthermore comprises a virtual clock 13 that progresses in accordance with the performance of the simulation. The process simulation apparatus 1 furthermore comprises an event receiver 14 that is explained in more detail further on. The process simulation apparatus 1 lastly comprises an apparatus 15 for adjusting an increment of the simulation steps $S_1$.

The controller simulation apparatus 2 comprises an execution system 25 for performing the simulation, which may be configured for example in accordance with the IEC 61131 standard. A simulation model 26 is also supplied to this execution system 25. The controller simulation apparatus 2 furthermore comprises a buffer 21 for the input values and a buffer 22 for the output values. The controller simulation apparatus 2 also comprises a virtual clock 23 that advances when the simulation is performed. The controller simulation apparatus 2 lastly comprises an event generator 24.

It is provided in this case that the event generator 24 outputs an event signal every time a simulation step $S_2$ using the controller simulation apparatus 2 has ended. By way of example, the event generator 24 may output an event signal if a main cycle of the controller or the programmable logic controller has been performed in the simulation. This event signal in this case comprises the corresponding result time $t_i$ of the virtual clock. The event signal is in this case transmitted to the event receiver 14 of the process simulation apparatus 1. Furthermore, the output values for this result time t are transmitted to the process simulation apparatus 1 by way of the controller simulation apparatus 2. After reception of the event signal, the increments or durations of the respective simulation steps $S_1$ are adjusted by way of the process simulation apparatus 1 using the device 15 such that they deliver a result at the result time $t_i$. Depending on the execution system 16 or a solver of the simulation, intermediate steps may also be calculated.

Numerical solvers are expanded so as to adjust the increment by way of the apparatus 15. By way of example, in the present case, the explicit Euler method is used, which is used to solve simple differential equations having a given starting value. In this case, the problem may be given in the form of a differential equation:

$$\frac{dy}{dt} = f(t, y), y(0) = y_0.$$

The approximation $y_k$ of the current function value $y(t_k)$ with the discrete time steps $t_k=t_0+kh$ and the increment h may then be calculated:

$$y_{k+1}=y_k+hf(t_k,y_k).$$

The increment h is typically controlled such that the steps are as large as possible (but limited) and it is ensured that the local error is below a threshold:

$$[[y_{k+1}-y(t_{k+1})]]=c_n h_n, \text{ where } c_n \overline{k}=\varepsilon.$$

This results in:

$$h_{k+1} = h_k \cdot \sqrt{\frac{\varepsilon}{\|y_{k+1} - y(t_{k+1})\|}}.$$

By expanding the algorithm, the following can be introduced: t is said to be the virtual time of the last event. For each of the simulation steps $S_1$, the increment $h_{k+1}$ and the virtual time $t_{k+1}$ resulting therefrom are determined. If $t_{k+1} > t_i$, the increment is set to $h_{k+1}=t_i-t_k$. Furthermore, the event is discarded.

Figure 4:
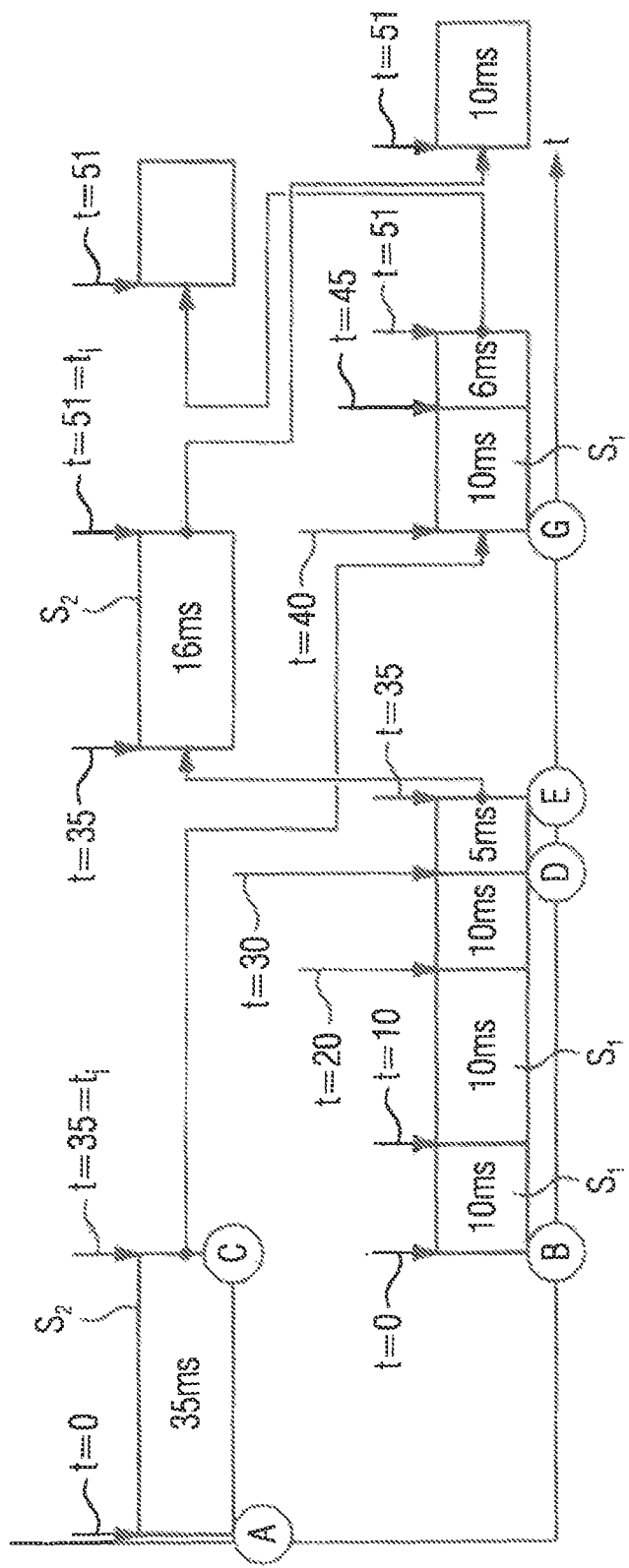
FIG. 4 shows a chronology of simulation steps that are performed using the device according to FIG. 3.

Overall, this results in the process simulation apparatus 1 and the controller simulation apparatus 2 always operating with up-to-date input values. This is depicted in FIG. 4, which shows a chronology of the simulation steps $S_1$ and $S_2$ that are performed using the device 4 according to FIG. 3. It is evident here that the duration or the increment of the first performed simulation steps $S_1$ has been adjusted by the process simulation apparatus 1. The duration of the last simulation step $S_1$ has been reduced from 10 ms to 5 ms. The four consecutive simulation steps $S_1$ thus end overall after a time of t=35 (event E), which corresponds to the result time $t_i$. In the same way, the simulation steps $S_1$ performed subsequently using the process simulation apparatus 1 have been adjusted such that they end at the time t=51.

According to one development, parallel performance of the simulations may also be provided. As already described, the process simulation apparatus 1 comprises the buffer 11 for the input values and the state of the simulation model. Previously determined results that have been received from the controller simulation apparatus 2 may also be stored in this buffer 11. In the same way as for the previously described method or algorithm, the received result time $t_i$, which is determined on the basis of the virtual clock 23 of the controller simulation apparatus 2, is compared by the process simulation apparatus 1 with the time $t_{k+1}$ of the virtual clock 13 of the process simulation apparatus 1 upon reception of the event signal. The process simulation apparatus 1 then deletes all of the calculated results or output values in the buffer 12 that were determined after the result time $t_i$. Following this, the process simulation apparatus 1 performs a new simulation, the input values with the greatest timestamp that were determined before the result time t being used in this case. For this simulation, the increments of the simulation steps $S_1$ are adjusted depending on the result time $t_i$, as described above. For the next simulation, the process simulation apparatus 1 then empties the buffer 11 and uses the values that it obtained together with the event signal. It is thus made possible for the process simulation apparatus 1 and the controller simulation apparatus 2 to always operate with up-to-date values.

The method may also be expanded to a plurality of process simulation apparatuses 1 and/or a plurality of controller simulation apparatuses 2. In this case, all of the simulation apparatuses that exchange data with at least one controller simulation apparatus 2 are able to adjust the increment or the duration of the simulation steps $S_1$, as described above.

In the present case, the duration of the simulation steps $S_2$ of the controller simulation apparatus is not changed, as these reflect the real behaviour of a programmable logic controller in accordance with the IEC 61131 standard. A requirement here is that the controller (with the exception of special events) reads the input values at the beginning of a main cycle and ignores all changes to the input values during the performance of the main cycle. In contrast thereto, a realistic simulation of the controlled process should take into account the exact time at which the controller influences the process.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled hi the art to best utilize the invention and various embodiments with various modifications as are suited to the particular use contemplated.

What is claimed is:

1. A device for simulating a controlled machine or installation, the device comprising:
    a process simulation apparatus comprising a first virtual clock and an event receiver, the process simulation apparatus configured to perform first simulation steps as a function of a first virtual time so as to simulate a physical process of the machine or installation, and
    a controller simulation apparatus comprising a second virtual clock and an event generator, the controller simulation apparatus configured to perform second simulation steps so as to simulate a controller of the machine or installation as a function of a second virtual time,
    wherein the process simulation apparatus and the controller simulation apparatus exchange output values so as to simulate the controlled machine or installation in the respective first and second simulation steps,
    wherein the controller simulation apparatus is configured to transmit an item of information to the process simulation apparatus, which item of information describes a virtual result time for an end of a second simulation step, said virtual result time based on the second virtual clock,
    wherein the process simulation apparatus further comprises a device configured to adjust a duration of at least one of the first simulation steps based on the first virtual dock depending on the virtual result time such that the at least one of the first simulation steps ends at the virtual result time,
    wherein the event generator is configured to generate an event signal describing the virtual result time when a second simulation step is terminated by the controller simulation apparatus, and the event receiver is configured to receive the event signal, and
    wherein the controller simulation apparatus is configured to transmit the output values determined during the second simulation steps to the process simulation apparatus at the virtual time result, and wherein the process simulation apparatus is configured to use the transmitted output values from the controller simulation apparatus as input values for performing at least one subsequent first simulation step so that the process simulation apparatus and the controller simulation apparatus operate sequentially in a co-simulation with up-to-date input values, wherein the controller simulation apparatus comprises an emulator for the controller program to be executed in a software-emulated controller.

2. The device of claim 1, wherein the process simulation apparatus comprises a buffer for storing the input values.

3. The device of claim 2, wherein the process simulation apparatus is configured to select at least one of the stored input values depending on a time at which the at least one input value was determined.

4. The device of claim 1, wherein the process simulation apparatus comprises a buffer for storing the respective output values of the process simulation apparatus, wherein output values determined after the result time are deleted.

5. The device of claim 1, wherein the device comprises a plurality of process simulation apparatuses and/or a plurality of controller simulation apparatuses.

6. The device of claim 1, wherein the process simulation apparatus is configured to transmit the output values determined during the first simulation steps at a time corresponding to the virtual result time to the controller simulation apparatus and the controller simulation apparatus is configured to use the transmitted output values from the process simulation apparatus as input values for performing at least one subsequent second simulation step.

7. A method for simulating a controlled machine or installation, comprising:
    with a process simulation apparatus that has a first virtual clock and an event receiver, simulating a physical process of the machine or installation by performing first simulation steps as a function of a virtual time,
    with a controller simulation apparatus that has a second virtual clock and an event generator, simulating a controller of the machine or installation by performing second simulation steps,
    determining output values in the first and second simulation steps,
    exchanging the output values between the process simulation apparatus and the controller simulation apparatus so as to simulate the controlled machine or installation,
    defining an item of information describing a virtual result time of an end of a second simulation step, said virtual result time based on the second virtual clock,
    transmitting the item of information with the controller simulation apparatus to the process simulation apparatus,
    with the process simulation apparatus further having a device, said device adjusting a duration of at least one first simulation step based on the first virtual clock depending on the virtual result time such that the at least one first simulation step ends at the virtual result time,
    generating with the event generator an event signal when a second simulation step was terminated with the controller simulation apparatus, wherein the event signal describes the virtual result time, and receiving the event signal with the event receiver, and
    transmitting the output values determined during, the second simulation steps from the controller simulation apparatus to the process simulation apparatus at the virtual time result, and performing in the process simulation apparatus at least one subsequent first simulation step based on input values defined by the transmitted output values from the controller simulation apparatus so that the process simulation apparatus and the controller simulation apparatus operate sequentially in a co-simulation with up-to-date input values,
    wherein the controller simulation apparatus comprises an emulator for the controller pro ram to be executed in a software-emulated controller.

8. The method of claim 7, further comprising storing the input values in a buffer of the process simulation apparatus.

9. The method of claim 8, further comprising selecting in the process simulation apparatus at least one of the stored input values depending on a time at which the at least one input value was determined.

10. The method of claim 7, further comprising storing the respective output values of the process simulation apparatus in a buffer of the process simulation apparatus, and deleting output values determined after the result time.

11. The method of claim 7, further comprising transmitting the output values determined during the first simulation steps at a time corresponding to the virtual result time from the process simulation apparatus to the controller simulation apparatus for performing in the controller simulation apparatus at least one subsequent second simulation step based on input values defined by the transmitted output values from the process simulation apparatus.

\* \* \* \* \*